(12) United States Patent
Bahmanian et al.

(10) Patent No.: US 12,281,939 B2
(45) Date of Patent: Apr. 22, 2025

(54) ADJUSTABLE SIGNAL SOURCE WITH LOW PHASE NOISE

(71) Applicant: UNIVERSITÄT PADERBORN, Paderborn (DE)

(72) Inventors: Meysam Bahmanian, Bochum (DE); Johannes Christoph Scheytt, Dorsten (DE)

(73) Assignee: UNIVERSITÄT PADERBORN, Paderborn (DE)

( * ) Notice: Subject to any disclaimer, the term of this patent is extended or adjusted under 35 U.S.C. 154(b) by 0 days.

(21) Appl. No.: 18/717,518

(22) PCT Filed: Dec. 9, 2022

(86) PCT No.: PCT/EP2022/085114
§ 371 (c)(1),
(2) Date: Jun. 7, 2024

(87) PCT Pub. No.: WO2023/105026
PCT Pub. Date: Jun. 15, 2023

(65) Prior Publication Data
US 2025/0044151 A1 Feb. 6, 2025

(30) Foreign Application Priority Data
Dec. 10, 2021 (DE) .................... 10 2021 214 164.1

(51) Int. Cl.
*G01J 1/44* (2006.01)
*G01J 1/08* (2006.01)
(52) U.S. Cl.
CPC . *G01J 1/44* (2013.01); *G01J 1/08* (2013.01); *G01J 2001/446* (2013.01)
(58) Field of Classification Search
CPC ........... G01J 1/44; G01J 1/08; G01J 2001/446
See application file for complete search history.

(56) References Cited

FOREIGN PATENT DOCUMENTS

| CN | 107124910 | 9/2017 |
|---|---|---|
| DE | 102021214164 | 6/2023 |
| WO | WO 2023/105026 | 6/2023 |

OTHER PUBLICATIONS

English Translation of Written Opinion for International (PCT) Patent Application No. PCT/EP2022/085114, dated Mar. 31, 2023, 7 pages.

(Continued)

*Primary Examiner* — David P Porta
*Assistant Examiner* — Gisselle M Gutierrez
(74) *Attorney, Agent, or Firm* — Sheridan Ross P.C.

(57) ABSTRACT

The invention relates to an adjustable signal source with low phase noise, comprising:
 an optical-microwave phase detector (BOMPD) which comprises:
  an intensity modulator (BIM) having an optical signal input, a modulation input (1), a first output (O1), and a second output (O2),
  a first photodiode (PD1) which can be irradiated by light from the first output (O1) during operation,
  a second photodiode (PD2) which can be irradiated by light from the second output (O2) during operation,
  wherein the first photodiode (PD1) and the second photodiode (PD2) are connected in series in a biased manner during operation,
  wherein a tap for a tap signal is arranged between the first photodiode (PD1) and the second photodiode (PD2),
 further comprising a controllable DC power source (N4),
 wherein an offset current is can be set at the tap during operation by means of the first DC power source (N4), whereby the symmetry of the optical-microwave phase detector is canceled by an offset current during operation, (Continued)

wherein the tap is routed to a low-pass filter with any potential offset current, wherein the low-pass filtered tap signal is provided to an adjustable oscillator (OSZ).

7 Claims, 3 Drawing Sheets

(56) References Cited

OTHER PUBLICATIONS

Official Action (with English translation) for Germany Patent Application No. 102021214164.1, dated Nov. 15, 2022, 12 pages.

Grant Decision (with English translation) for Germany Patent Application No. 102021214164.1, dated May 17, 2024, 20 pages.

Register Information (English translation) for Germany Patent Application No. 102021214164.1, dated Jun. 4, 2024, 3 pages.

Bahmanian et al., "A 2-20-GHz Ultralow Phase Noise Signal Source Using a Microwave Oscillator Locked to a Mode-Locked Laser," IEEE Transactions on Microwave Theory and Techniques, vol. 69, No. 3, Mar. 2021, pp. 1635-1645.

Bahmanian et al., "Octave-Band Microwave Frequency Synthesizer Using Mode-Locked Laser as a Reference," International Topical Meeting on Microwave Photonics, Oct. 7-10, 2019, 4 pages.

Hou et al., "Long-term Stabilization of Fiber Laser Using Phase-locking Technique with Ultra-low Phase Noise and Phase Drift," IEEE Journal of Selected Topics in Quantum Electronics, vol. 20, No. 5, Sep. 30, 2014, 8 pages.

Jung et al., "Subfemtosecond synchronization of microwave oscillators with mode-locked Er-fiber lasers," Optics Letters, vol. 37, No. 14, Jul. 15, 2012, pp. 2958-2960.

International Search Report and Written Opinion for International (PCT) Patent Application No. PCT/EP2022/085114, dated Mar. 31, 2023, 13 pages.

Prior art

ADJUSTABLE SIGNAL SOURCE WITH LOW PHASE NOISE

CROSS REFERENCE TO RELATED APPLICATIONS

This application is a national stage application under 35 U.S.C. 371 and claims the benefit of PCT Application No. PCT/EP2022/085114 having an international filing date of 9 Dec. 2022, which designated the United States, which PCT application claimed the benefit of German Patent Application No. 10 2021 214 164.1 filed 10 Dec. 2021, the disclosures of each of which are incorporated herein by reference in their entireties.

BACKGROUND

Providing a signal with low phase noise is desirable in many areas of electrical engineering. It would be particularly desirable for this signal source to be adjustable over a wide frequency range and at a high frequency resolution.

By way of example, one use would be locking a microwave oscillator to an optical clock signal of such a signal source. Another use would be distributing an optical clock signal via a low-loss fiber with low phase noise.

A variety of approaches are known from the prior art.

For example, a device which enables a microwave oscillator to be locked to integer harmonics of the repetition rate of an optical clock is described in the article titled "Sub-femtosecond synchronization of microwave oscillators with mode-locked Er-fiber lasers," authored by Kwangyun Jung and Jungwon Kim and published in Optics Letters, vol. 37, no. 14, p. 2958 July 2012, https://doi.org/10.1364/OL.37.002958.

A symmetric optical-microwave phase detector is also described in the article titled "A 2-20-GHz ultralow phase noise signal source using a microwave oscillator locked to a mode-locked laser" by authors and inventors M. Bahmanian and J. C. Scheytt, published in IEEE Transactions on Microw. Theory Tech. pp. 1-1 (2021).

These articles also show that a microwave phase detector comprising a fiber-based Sagnac-loop intensity modulator or a Mach-Zehnder intensity modulator can be used for this purpose.

All of the previous approaches known to the inventors have in common the fact that the current system designs are only able to provide a high-frequency signal which is an integer multiple of the repetition rate of the optical signal source. This means that the output frequency is obtained as $f_{out}=N*f_{rep}$ where $N \in \mathbb{N}$.

In the previous approaches familiar to the inventors, the symmetrical modulator is biased at its odd symmetry point, i.e., biasing at this point leads to the intensities of the optical outputs being equal. In this kind of approach, the sign of the output current of the symmetrical optical-microwave phase detector changes at a zero-valued phase difference for all high-frequency amplitudes.

The disadvantage of the previously known approaches is that they are only suitable for providing a precisely defined (non-adjustable) frequency, or they are only able to generate precisely predetermined integer multiples.

Also disadvantageous is that some of the structures have a very complex design. Other deficiencies include, e.g., a relatively high space requirement, which is particularly the case for a fiber-based Sagnac-loop intensity modulator, and high costs.

Object

Against this background, the object of the invention is to provide an improvement. In this context, one goal in particular is to provide an uncomplicated space-saving design. A further goal is to improve frequency resolution.

BRIEF DESCRIPTION OF THE INVENTION

Said object is achieved by means of an adjustable signal source with low phase noise according to claim 1. Further advantageous embodiments of the invention are the subject of the dependent claims, the description, and the figures.

BRIEF DESCRIPTION OF THE FIGURES

The invention will be explained in greater detail hereinafter with reference to the figures.

DETAILED DESCRIPTION OF THE INVENTION

The invention will be described in further detail below with reference to the figures. It should be noted that various aspects are described, each of which can be used individually or in combination. In other words, any aspect can be used with various embodiments of the invention, unless explicitly described as a mere alternative.

Furthermore, for the sake of simplicity, generally only one entity is referred to below. Unless explicitly noted, however, the invention can also comprise a plurality of the entities concerned. In this regard, the use of the words "a" and "one" is to be understood only as an indication that at least one entity is being used in a single embodiment.

Insofar as methods are described below, the individual method steps can be arranged and/or combined in any desired order, unless the context explicitly indicates otherwise. In addition, the methods can be combined with one another unless expressly indicated otherwise.

Generally speaking, specifications including numerical values are not to be understood as exact values, but have a tolerance of +/−1% to +/−10%.

References to standards or specifications are to be understood as references to standards or specifications which apply or applied at the time of the application and/or—if priority is being claimed—at the time of the priority application. However, this is not to be understood as a general exclusion of applicability to subsequent or superseding standards or specifications.

A device or method will be explained below with reference to the figures.

Before explaining the invention in detail, we will first describe the theoretical background of "interharmonic locking."

Figure 1A:
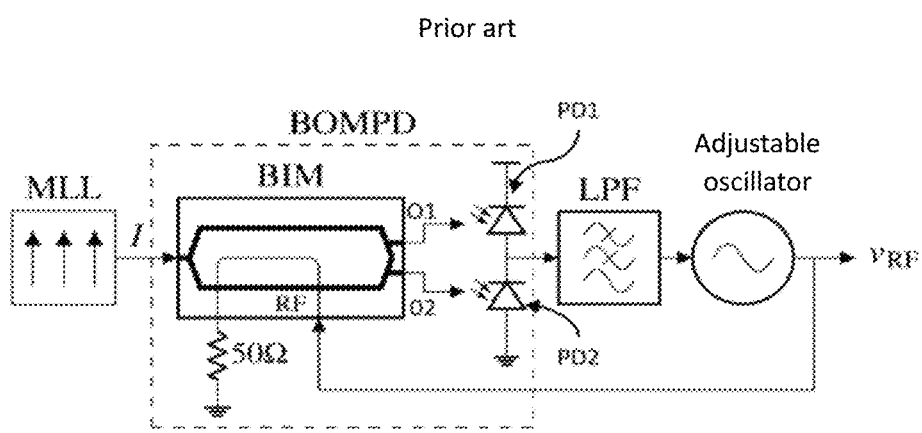
FIG. 1a schematically shows a symmetric optical-microwave phase detector according to the prior art, FIG. 1b schematically shows a block equivalent circuit diagram for this purpose, FIG. 2 schematically shows a symmetric optical-microwave phase detector according to the invention.
Figure 3A:
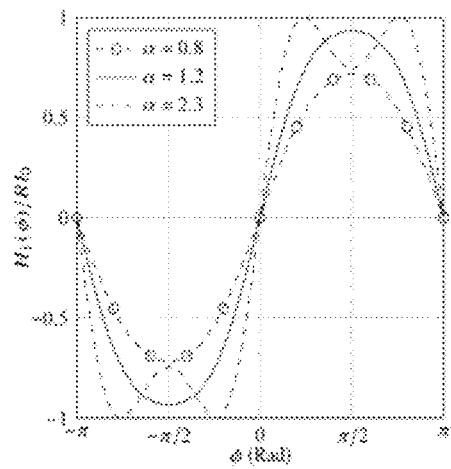
FIGS. 3a-d show graphs of measurements according to embodiments of the invention in relation to theoretical values.
Figure 3B:
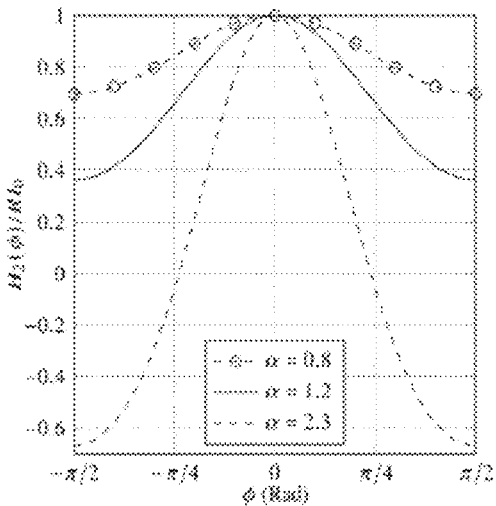
Figure 3C:
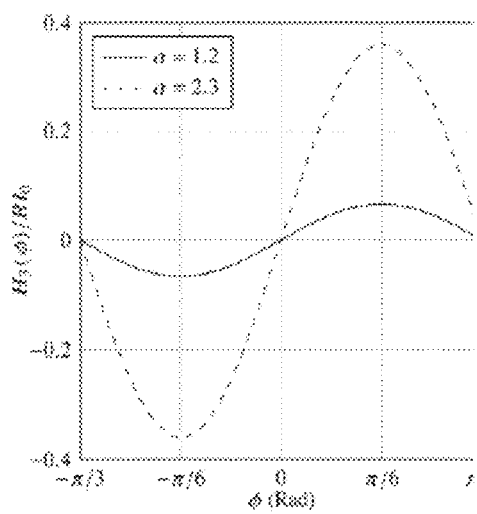
Figure 3D:
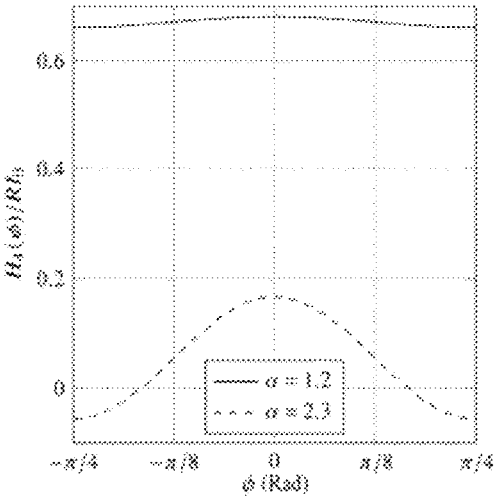

FIG. 1a shows a block diagram of an optoelectronic PLL circuit. The output voltage of the adjustable oscillator is sampled by the pulses of a mode-locked laser (MLL). The BIM intensity modulator is used for this purpose. This BIM intensity modulator is also known as a balanced intensity modulator and represents an electro-optical converter.

The outgoing optical pulses from the BIM intensity modulator are converted here into an electrical current via the two photodiodes PD1, PD2. The resulting current is then integrated via the loop filter before being routed back to the adjustable oscillator, closing the control path.

The output current can be represented as follows:

$$i = RI(t)\sin\left(\frac{v_{RF}\pi}{V_{\pi,RF}} + \psi_{dc}\right),$$

where i is the output current of the optical-microwave phase detector BOMPD, R is the sensitivity of the photodiode, I(t) is the intensity of the optical input to the optical-microwave phase detector (BOMPD) averaged over one optical cycle, $\psi_{dc}$ is the optical phase shift introduced by the DC electrode, $V_{\pi,RF}$ is the $\pi$ voltage of the RF electrode, and $v_{RF}$ is the sinusoidal RF modulation voltage at an amplitude of $V_{RF}$, an angular frequency of $\omega_{RF}$, and a phase offset of $\phi$ ($v_{RF}$)=$V_{RF}$ Sin ($\omega_{RF}t+\phi$).

The sine term in the first equation indicates that the RF voltage is subject to a nonlinear transformation which produces harmonic monotonal RF excitation.

Consequently, the BOMPD optical-microwave phase detector can be modeled as a nonlinear block and a frequency mixer. The nonlinear behavior of the BOMPD optical-microwave phase detector can then be used to lock the microwave oscillator to a harmonic rather than to the respective fundamental frequency, i.e., to an even-number multiple of the optical reference repetition rate.

Figure 1B:
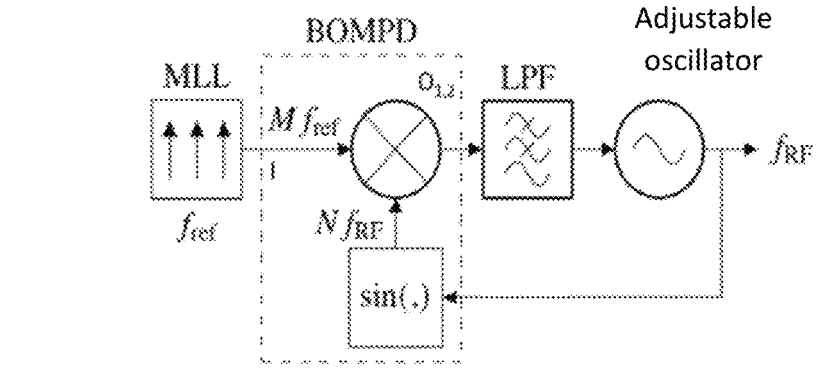

The frequency content of the various nodes of the BOMPD optical-microwave phase detector is shown in FIG. 1b, in which M is the harmonic index of the repetition rate of the optical reference and N is the harmonic index of the RF voltage.

The optoelectronic PLL circuit locks when the frequency of the mixer inputs fulfills the following equation:

$$f_{RF} = \frac{M}{N} f_{ref},$$

where M and N are positive integers with a greatest common divisor of 1.

Below, the operation of the optoelectronic PLL circuit when N=1 is referred to as harmonic locking, and as interharmonic nth-order locking when N>1.

Assuming that optical pulses of the mode-locked laser (MLL) are significantly shorter than that of the RF signal period, each pulse can be approximated as a Dirac delta function:

$$I(t) = I_0 T_{ref} \sum_{m=-\infty}^{+\infty} \delta\left(t - \frac{m}{f_{ref}}\right),$$

where $I_0$ is the average intensity of the optical input, and $T_{ref}=1/f_{ref}$.

The equation where $\alpha=\pi V_{RF}/V_{\pi\,RF}$ can then be rewritten as follows:

$$i = RI_0 T_{ref} \sum_{m=-\infty}^{+\infty} \delta\left(t - \frac{m}{f_{ref}}\right)\sin[\alpha\ \sin(\omega_{RF}t + \phi) + \psi_{dc}].$$

The characteristic function (transfer function) of the phase detector is defined as the average output current relative to the phase difference between the inputs.

For the phase detection of interharmonic nth-order locking, the output current of the above equation has a period of $NT_{ref}$. Therefore, the characteristic function (transfer function) of the optical-microwave phase detector BOMPD $H_N(\varphi)$ can be indicated as follows:

$$H_N(\phi) = \frac{1}{NT_{ref}} \int_0^{NT_{ref}} dt\ i = \frac{RI_0}{N} \sum_{m=0}^{N-1} \sin\left[\alpha\ \sin\left(\frac{2\pi m}{N} + \phi\right) + \psi_{dc}\right],$$

whereby, in this equation, the index M was disregarded by assuming the greatest common multiple of M and N to be 1.

The first-, second-, and fourth-order characteristic functions (transfer functions) for the BOMPD phase detector, which correspond accordingly to a harmonic locking, a second-order interharmonic locking, and a fourth-order interharmonic locking, can be obtained from this:

$$H_1(\phi) = RI_0 \mathrm{in}(\alpha\ \sin(\phi) + \psi_{dc})$$

$$H_2(\phi) = RI_0 \sin(\psi_{dc})\cos[\alpha\ \sin(\phi)]$$

$$H_4(\phi) = \frac{1}{2} RI_0 \sin(\psi_{dc})[\cos(\alpha\ \sin\phi) + \cos(\alpha\ \cos\phi)]$$

The last two equations $H_2(\phi)$ and $H_4(\phi)$ show that the second- and fourth-order characteristic functions (transfer functions) for the BOMPD phase detector scale linearly with sin ($\Psi_{dc}$) and become zero when $\Psi_{dc}=0$. This behavior is to be expected because the nonlinear characteristic function (transfer function) for the BOMPD phase detector shown at the beginning shows equal symmetry (axial symmetry) in relation to $v_{RF}$ when $\Psi_{dc}=\pm\pi/2$ and unequal symmetry (point symmetry) when $\Psi_{dc}=0$. In a single-tone excitation, only odd harmonics are generated when $\Psi_{dc}=0$ and only even harmonics are generated when $\Psi_{dc}==\pm\pi/2$.

The magnitude of $H_N(\phi)$ can be represented using the Jacobi-Anger expansion as follows:

$$\langle H_N(\phi) \rangle = RI_0 \sin(\psi_{dc}) J_0(\alpha),$$

where <.> is the average value, and $J_0$ indicates the zero-order Bessel function of the first kind. A zero-value average $H_N(\phi)$ guarantees a zero crossing in the transfer function.

The invention will be explained in greater detail below with reference to FIG. 2 (and referring back to the prior art according to FIG. 1a). The same reference signs will, to the extent possible, be used here.

Figure 2:
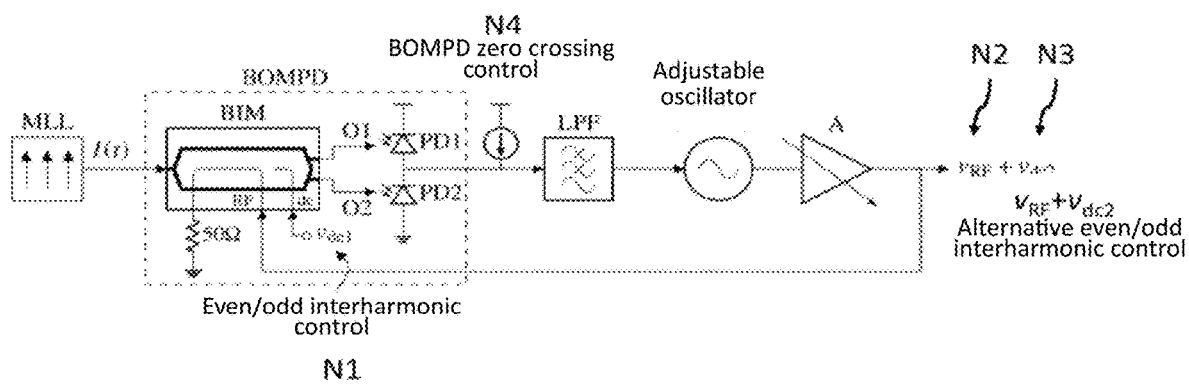

FIG. 2 shows an application of an adjustable signal source with low phase noise. The adjustable signal source has a BOMPD optical-microwave phase detector. This design is initially provided as in the prior art ("A 2-20-ghz ultralow phase noise signal source using a microwave oscillator locked to a mode-locked laser").

The BOMPD microwave phase detector in this case initially comprises an intensity modulator (BIM) having an optical signal input, a modulation input I, a first output O1, and a second output O2. The BIM intensity modulator in FIGS. 1a/1b and in FIG. 2 is also known as a balanced intensity modulator and represents an electro-optical converter. The configuration of the BIM intensity modulator can be designed in various ways.

The BOMPD microwave phase detector further comprises a first photodiode PD1, which can be irradiated by light from the first output O1 during operation, and a second photodiode PD2, which can be irradiated by light from the second output O2 during operation.

In contrast to the prior art design and within the scope of the invention, the first photodiode PD1 and the second photodiode PD2, which are connected in series, are now biased during operation. The series circuitry is designed such that a tap for a tap signal is arranged between the first photodiode (PD1) and the second photodiode (PD2).

The BOMPD microwave phase detector further comprises a controllable DC power source (BOMPD zero crossing control) N4, whereby an offset current can be adjusted at the tap during operation by means of the DC power source, as a result of which the zero crossing in the transfer function for the BOMPD is changed, and the symmetry of the optical-microwave phase detector is thus canceled by the offset current during operation. In other words, unlike in the prior art, symmetrical operation of the BOMPD is deliberately not attempted.

The tap output is routed to a low-pass filter during operation with any potential offset current, whereby the low-pass-filtered tap signal is provided to an adjustable oscillator OSZ.

By adding an offset current by means of the controllable DC power source N4 (BOMPD zero crossing control), it is now possible for the BOMPD microwave phase detector to also lock to odd-numbered multiples of the optical pulse repetition rate in order to achieve a sign change for the output current from the BOMPD microwave phase detector.

In one embodiment of the invention, the adjustable signal source further comprises a controllable DC voltage source N1 (odd/even interharmonic control), in which case the intensity modulator BIM has an input for the DC voltage source N1.

By providing the DC voltage source, the DC voltage electrode of the BIM intensity modulator is able to bias at the equivalent point of the symmetry such that it is likewise possible for the BOMPD microwave phase detector to also lock to odd-numbered multiples of the optical pulse repetition rate. This is because if a symmetrical modulator is biased at this point, the intensity of one of the outputs O1, O2 will tend toward the maximum, whereas the intensity of the other output O2, O1 will then simultaneously tend toward the minimum. Therefore, the output frequency can then be reliably set to $$f_{out} = \frac{N \cdot f_{rep}}{M} \text{ where } N, M \in \mathbb{N}.$$

Another embodiment of the invention comprises the adjustable signal source, which further comprises a second controllable DC voltage source N2, N3 (alternative even/odd interharmonic control), whereby the feedback output signal from the adjustable oscillator OSZ is supplied to the modulation input I during operation, whereby the DC voltage from the second DC voltage source N2, N3 is also supplied to the modulation input (I) during operation.

The function of the second controllable DC voltage source (alternative even/odd interharmonic control) N2, N3 consists of the DC portion (i.e., the average level) of the oscillator signal OSZ being adjustable. This can be achieved by, e.g., adding a DC voltage to the signal from the oscillator OSZ.

A change in the DC voltage of the high-frequency electrode of the BIM intensity modulator can be used such that the BIM intensity modulator locks at a frequency of $$f_{out} = \frac{N \cdot f_{rep}}{M},$$

thus achieving the sign change of the output current from the BOPMD optical-microwave phase detector at a specific phase offset. In addition, the DC voltage of the high frequency electrode of the BIM intensity modulator can be biased at the point where the characteristic curve is mirror-symmetrical, and be locked to an odd-numbered multiple of the optical pulse repetition rate. If a symmetrical modulator is biased at this point, then the intensity of one of the outputs O1, O2 will in turn tend toward the maximum, whereas the intensity of the other output O2, O1 will then simultaneously tend toward the minimum.

In a further embodiment of the invention, the adjustable signal source also comprises a mode-locked laser (MLL), which provides an optical input signal to the optical signal input during operation.

In a further embodiment of the invention, the oscillator OSZ is set to non-integer multiples of the optical clock repetition time. In other words, in addition to the version in which only one specific odd-numbered multiple can be provided, a selectable multiple can also be set.

Within the scope of the invention, it is now also possible for a fiber-based Sagnac loop BIM intensity modulator to also be used. However, the intensity modulator is now operated at a phase shift in order to appropriately bias it at the even symmetry point.

As a result of the invention, a compact design with low phase noise and a low level of complexity is now possible. The frequency resolution is also improved, so that multiples where $$f_{out} = \frac{N \cdot f_{rep}}{M}$$

and $N, M \in \mathbb{N}$ can also be set. In contrast to purely electronic signal sources, the phase noise is also improved, i.e. decreased.

Without limiting the overall invention, an optional amplifier A can also be arranged in the feedback branch.

FIGS. 3 $a$-$d$ show characteristic curves known according to theory.

In this context, FIGS. 3$a$-3$d$ show BOMPD characteristic curves according to theory (dotted) and according to measurements for:
 a) harmonic locking when $\psi_{dc}=0$,
 b) second-order interharmonic locking when $\psi_{dc}=\pi/2$,
 c) third-order interharmonic locking when $\psi_{dc}=0$ and
 d) fourth-order interharmonic locking when $\psi_{dc}=\pi/2$ for various RF amplitudes where $\alpha=0.8$, $\alpha=1.2$, or $\alpha=2.3$.

The amplitude of the oscillator signal can be adjusted using the adjustable amplifier A, which leads to a change in the factor $\alpha$. As seen in the characteristic curves in FIGS. 3$a$-3$d$, the characteristic curves are dependent on $\alpha$. It can also be seen that not all of the curves have a zero crossing. If the characteristic curve does not have a zero crossing, then the control loop cannot lock. In other words, given an appropriate setting for the oscillator amplitude $v_{RF}$, the factor α can be adjusted such that the characteristic curve has a zero crossing, and an interharmonic locking is therefore possible.

LIST OF REFERENCE SIGNS

BOPMD Optical-microwave phase detector
BIM Intensity modulator
I Modulation input
O1, O2 Output
PD1, PD2 Photodiode
N4 Controllable DC power source
OSZ Adjustable oscillator
N1, N2, N3 Controllable DC source
MLL Mode-locked laser
A Adjustable amplifier

What is claimed is:

1. An adjustable signal source with low phase noise, comprising:
    an optical-microwave phase detector, comprising:
        an intensity modulator having an optical signal input, a modulation input, a first output, and a second output,
        a first photodiode which can be irradiated by light from the first output during operation,
        a second photodiode which can be irradiated by light from the second output during operation,
        wherein the first photodiode and the second photodiode are connected in series in a biased manner during operation,
        wherein a tap for a tap signal is arranged between the first photodiode and the second photodiode,
    further comprising a first controllable DC power source,
    wherein an offset current is adjustable at the tap during operation by means of the first controllable DC power source, whereby the symmetry of the optical-microwave phase detector is canceled by the offset current during operation,
    wherein the tap is routed to a low-pass filter with any potential offset current,
    wherein a low-pass-filtered tap signal is provided to an adjustable oscillator.

2. The adjustable signal source according to claim 1, further comprising a second controllable DC voltage source, wherein the intensity modulator comprises an input for the second controllable DC voltage source.

3. The adjustable signal source according to claim 1, further comprising a second controllable DC voltage source, wherein a feedback output signal from the adjustable oscillator is supplied to the modulation input during operation, wherein a DC voltage from the second controllable DC voltage source is also supplied to the modulation input during operation.

4. The adjustable signal source according to claim 1, further comprising an amplifier, wherein the amplifier is configured to adjust an oscillator amplitude such that an interharmonic locking is enabled.

5. The adjustable signal source according to claim 1, further comprising a mode-locked laser, which provides an optical input signal to the optical signal input during operation.

6. The adjustable signal source according to claim 1, wherein the adjustable oscillator is set to non-integer multiples of an optical clock repetition time.

7. An adjustable signal source with low phase noise, comprising:
    an optical-microwave phase detector, comprising:
        an intensity modulator having an optical signal input, a modulation input, a first output, and a second output,
        a first photodiode which can be irradiated by light from the first output during operation,
        a second photodiode which can be irradiated by light from the second output during operation,
        wherein the first photodiode and the second photodiode are connected in series in a biased manner during operation,
        wherein a tap for a tap signal is arranged between the first photodiode and the second photodiode,
    further comprising a first controllable DC power source, a second controllable DC voltage source, an amplifier, and a mode-locked laser that provides an optical input signal to the optical signal input during operation,
    wherein an offset current is adjustable at the tap during operation by means of the first controllable DC power source, whereby the symmetry of the optical-microwave phase detector is canceled by the offset current during operation,
    wherein the tap is routed to a low-pass filter with any potential offset current,
    wherein a low-pass-filtered tap signal is provided to an adjustable oscillator,
    wherein the intensity modulator comprises an input for the second controllable DC voltage source,
    wherein a feedback output signal from the adjustable oscillator is supplied to the modulation input during operation, wherein a DC voltage from the second controllable DC voltage source is also supplied to the modulation input during operation,
    wherein the amplifier is configured to adjust an oscillator amplitude such that an interharmonic locking is enabled, and
    wherein the adjustable oscillator is set to non-integer multiples of an optical clock repetition time.

* * * * *